(12) United States Patent
Chevallier

(10) Patent No.: US 6,597,609 B2
(45) Date of Patent: Jul. 22, 2003

(54) NON-VOLATILE MEMORY WITH TEST ROWS FOR DISTURB DETECTION

(75) Inventor: Christophe J. Chevallier, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/943,480

(22) Filed: Aug. 30, 2001

(65) Prior Publication Data

US 2003/0043661 A1 Mar. 6, 2003

(51) Int. Cl.[7] .................................................. G11C 7/00
(52) U.S. Cl. ....................................... 365/201; 365/196
(58) Field of Search ................................. 365/201, 196, 365/185.22, 185.29

(56) References Cited

U.S. PATENT DOCUMENTS

| | | | |
|---|---|---|---|
| 5,299,147 A | 3/1994 | Holst | 365/49 |
| 5,487,044 A | 1/1996 | Kawaguchi et al. | 365/203 |
| 5,490,110 A | 2/1996 | Sawada et al. | 365/185.03 |
| 5,572,692 A | 11/1996 | Murdoch et al. | 395/405 |
| 5,617,350 A | 4/1997 | Roohparvar | 365/185.02 |
| 5,627,838 A * | 5/1997 | Lin et al. | 371/21.1 |
| 5,644,530 A | 7/1997 | Gaultier | 365/185.09 |
| 5,671,176 A | 9/1997 | Jang et al. | 365/185.02 |
| 5,715,193 A | 2/1998 | Norman | 365/185.02 |
| 5,818,757 A | 10/1998 | So et al. | 365/185.18 |
| 5,838,040 A * | 11/1998 | Salter, III et al. | 257/321 |
| 5,896,316 A | 4/1999 | Toyoda | 365/185.02 |
| 5,912,837 A | 6/1999 | Lakhani | 365/185.02 |
| 5,920,501 A | 7/1999 | Norman | 365/185.02 |
| 5,963,473 A | 10/1999 | Norman | 365/185.02 |
| 5,981,340 A | 11/1999 | Chang et al. | 438/258 |
| 5,991,202 A | 11/1999 | Derhacobian et al. | 365/185.19 |
| 5,991,213 A | 11/1999 | Cline et al. | 365/201 |
| 6,026,018 A | 2/2000 | Herdt et al. | 365/185.07 |
| 6,058,060 A | 5/2000 | Wong | 365/218 |
| 6,061,270 A | 5/2000 | Choi | 365/185.02 |
| 6,078,534 A | 6/2000 | Pfefferl et al. | 365/200 |
| 6,101,150 A | 8/2000 | Roohparvar | 365/230.06 |
| 6,108,240 A | 8/2000 | Lavi et al. | 365/185.29 |
| 6,181,599 B1 | 1/2001 | Gongwer | 365/185.18 |
| 6,222,761 B1 | 4/2001 | Gerber et al. | 365/185.02 |
| 6,285,592 B1 * | 9/2001 | Kubota | 365/185.22 |
| 6,285,593 B1 | 9/2001 | Wong | 365/185.23 |
| 6,285,608 B1 | 9/2001 | Roohparvar | 365/201 |
| 6,407,953 B1 * | 6/2002 | Cleeves | 365/201 |
| 6,459,623 B1 * | 10/2002 | Yoshida | 365/185.29 |

* cited by examiner

*Primary Examiner*—M. Tran
(74) *Attorney, Agent, or Firm*—Leffert Jay & Polglaze P.A.

(57) ABSTRACT

A non-volatile memory device has an array of memory cells arranged in rows and columns. The memory cells can be externally accessed for programming, erasing and reading operations. Test rows of memory cells are provided in the array to allow for memory cell disturb conditions. The test rows are not externally accessible for standard program and read operations. The test rows are located near bit line driver circuitry to insure the highest exposure to bit line voltages that may disturb memory cells in the array.

34 Claims, 6 Drawing Sheets

NON-VOLATILE MEMORY WITH TEST ROWS FOR DISTURB DETECTION

TECHNICAL FIELD OF THE INVENTION

The present invention relates generally to memory devices and in particular the present invention relates to non-volatile memory devices and leakage detection.

BACKGROUND OF THE INVENTION

Electrically erasable and programmable read only memories (EEPROMs) are reprogrammable non-volatile memories that are widely used in computer systems for storing data. The typical data storage element of an EEPROM is a floating gate transistor, which is a field-effect transistor (FET) having an electrically isolated (floating) gate that controls electrical conduction between source and drain regions. Data is represented by charge stored on the floating gate and the resulting conductivity obtained between source and drain regions.

For example, a floating gate memory cell can be formed in a P-type substrate with an N-type diffused source region and an N-type drain diffusion formed in the substrate. The spaced apart source and drain regions define an intermediate channel region. A floating gate, typically made of doped polysilicon, is located over the channel region and is electrically isolated from the other cell elements by oxide. For example, a thin gate oxide can be located between the floating gate and the channel region. A control gate is located over the floating gate and can also be made of doped polysilicon. The control gate is separated from the floating gate by a dielectric layer.

To program a memory cell, a high positive voltage Vg, such as +12 volts, is applied to the control gate of the cell. In addition, a moderate positive voltage of about +6 to +9 volts is applied to the drain (Vd) and the source voltage (Vs) is at ground level, as is a substrate voltage (Vsub). In prior memories, the current requirements for the +12 volts applied to the control gate and the +6 to +9 volts applied to the drain region are relatively small. This is due in large part to the fact that only a few flash cells are ever programmed at one time; thus, these voltages can be generated on the integrated circuit utilizing charge pump circuitry that is powered by the primary supply voltage Vcc. The above voltage ranges are based upon the assumption that the primary supply voltage Vcc for the memory is +5 volts.

The above conditions result in the inducement of hot electron injection in the channel region near the drain region of the memory cell. These high-energy electrons travel through the thin gate oxide towards the positive voltage present on the control gate and collect on the floating gate. The electrons remain on the floating gate and function to increase the effective threshold voltage of the cell as compared to a cell that has not been programmed. The memory cells can be erased to remove the floating gate charge. Erase operations are typically performed simultaneously on a block of memory cells of a flash memory device. During an erase operation, one of the blocks is selected. In one embodiment, the un-selected blocks remain coupled to common bit lines, the unselected blocks are subjected to the erase voltage coupled to the selected bit line. These erase voltages can disturb the memory cells in the un-selected blocks. A time consuming process of checking the memory cells in the un-selected blocks is typically performed to identify cells that required repair.

Further, as memory cell population densities increase, the physical space allocated to device components decreases. For example, bit lines used to couple memory cells located in a column of the memory device may increase in length and decrease in width. These changes in the bit lines result in an increased resistance for the bit line. As such, programming speeds of some memory cells may increase as a result of slower propagation times. Further, bit line driver circuits must be able to provide higher program voltages to overcome the increased voltage drop along bit lines as a result of the increased resistance.

During an erase operation, the gate is grounded or brought to a negative voltage, while the source is brought to a high voltage, such as 6 or 10 volts. The drain of the cells is left floating and will typically go to a voltage around 3 volts due to source to drain leakage. In another embodiment, often called "channel erase" (as opposed to "source erase" described above), the gate is brought negative while the source, the substrate of the cell and/or the drain are brought high. In this case, the drain, or bit line voltage will be at the same value as the source, about 6 volts.

In both cases, the bit lines will be at a positive voltage. In a memory where common bit lines are shared across erase blocks, this positive voltage will create a disturb situation. In this disturb situation, memory cells in an un-selected block see 3 to 6 volts on their drain, while their source and gate are grounded. This condition, called drain disturb, results in a lowering of cell threshold voltage of the disturbed cells which affects the data stored in the cells if the data stored was a "0" (programmed state).

A similar condition appears during a program operation, where the bit line will be at 6V, and therefore the cells sharing this bit line in unselected blocks will have their drains at 6V, and their sources and gates grounded. During a program operation the cells located closest to the data driver will see the highest drain voltage since the voltage drop from the data driver to cells is least. During an erase operation no current flows in the bit lines, so the drain voltage will be similar on all cells.

For the reasons stated above, and for other reasons stated below which will become apparent to those skilled in the art upon reading and understanding the present specification, there is a need in the art for a disturb detection in a non-volatile memory device.

SUMMARY OF THE INVENTION

The above-mentioned problems with memory devices and other problems are addressed by the present invention and will be understood by reading and studying the following specification.

In one embodiment, a non-volatile memory device comprises an array of non-volatile memory cells arranged in rows and columns, a plurality of bit lines coupled to the non-volatile memory cells, a driver circuit coupled to the plurality of bit line, and test rows coupled to the array and located near the driver circuit.

In another embodiment, a flash memory device comprises an array of floating gate non-volatile memory cells arranged in rows and columns, a bit line coupled to the non-volatile memory cells, and first and second driver circuits respectively coupled to first and second end regions of the bit line. A decoder circuit is provided to selectively couple the first and second driver circuits to the bit line. First and second sets of addressable memory cell test rows are coupled to the array and respectively located near the first and second driver circuits.

A method of erasing memory cells in a non-volatile memory device is provided. The method comprises initiating an erase operation on memory cells located in a first part of an addressable array of memory cells, and performing a disturb test operation on test rows to forecast if memory cells located in a second part of the addressable array of memory cells were disturbed during the erase operation.

Another method of operating a non-volatile memory system comprises initiating an erase operation on memory cells located in a first block of an array of memory cells of a memory device in response to instructions from an external processor, performing a disturb test operation on test rows to forecast if memory cells located in additional blocks of the array were disturbed during the erase operation, and performing a data recovery operation on the memory cells located in the additional blocks of the array based upon the disturb test operation.

The invention further provides methods and apparatus of varying scope.

DETAILED DESCRIPTION OF THE INVENTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
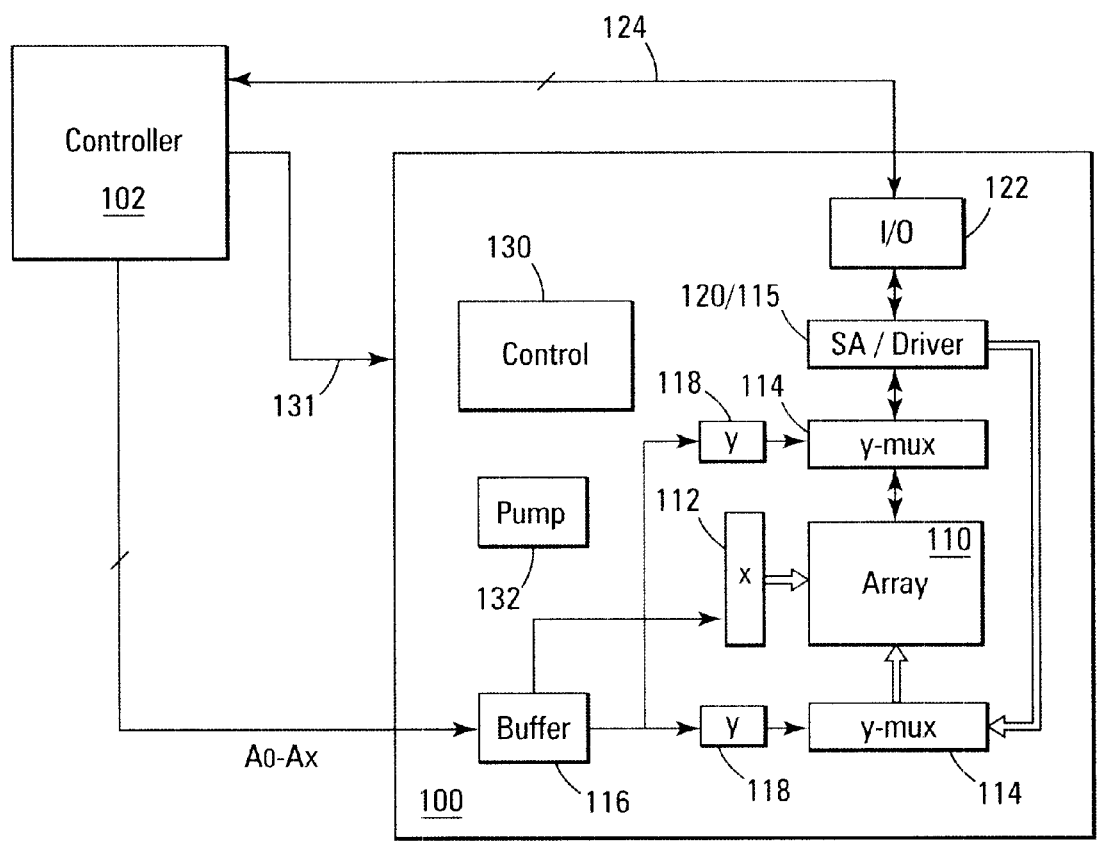
FIG. 1 is a block diagram of a memory of one embodiment of the present invention.

FIG. 1 illustrates a block diagram of a flash memory device 100 that is coupled to a controller 102. The memory device has been simplified to focus on features of the memory that are helpful in understanding the present invention. The memory device includes an array of memory cells 110. The memory cells are preferably floating gate memory cells, and the array is arranged blocks of rows and columns. The blocks allow memory cells to be erased in large groups. Data, however, is stored in the memory array in small data groups (byte or group of bytes) and separate from the block structure. Erase operations are usually performed on a large number of cells in parallel.

An x-decoder 112 and y-decoders 114, 118 are provided to decode address signals provided on address lines A0–Ax. Address signals are received and decoded to access the memory array. An address buffer circuit 116 is provided to latch the address signals. A y-decoder circuit is provided to select a column of the array and includes a y-select circuit 118, and a y-mux 114. Sense amplifier and compare circuitry 120 is used to sense data stored in the memory cells and verify the accuracy of stored data. Data driver circuitry 115 is provided at opposite ends of array 110, as explained below, to efficiently drive data to bit lines of the array.

Data input and output buffer circuits 122 are included for bi-directional data communication over a plurality of data (DQ) lines 124 with the processor. Command control circuit 130 decodes signals provided on control lines 131 from the processor. These signals are used to control the operations of the memory, including data read, data write, and erase operations. A state machine(s) can be provided as part of the control circuitry to perform read, write and erase operations. The flash memory may include a charge pump circuit 132 that generates an elevated voltage, Vpp, used during programming of the memory cells and other internal operations. During write operations, Vpp is coupled to the memory cells for providing appropriate write operation programming power. Charge pump designs are known to those skilled in the art, and provide power which is dependant upon an externally provided supply voltage Vcc. Typically, a flash memory will include separate charge pumps to provide for different needs, such as charge pumps that generate a 12 volt and 5 volt supplies.

As stated above, the flash memory of FIG. 1 has been simplified to facilitate a basic understanding of the features of the memory. Further, it will be appreciated that more than one flash memory can be included in various package configurations. For example, flash memory cards can be manufactured in varying densities using numerous flash memories.

Figure 2:
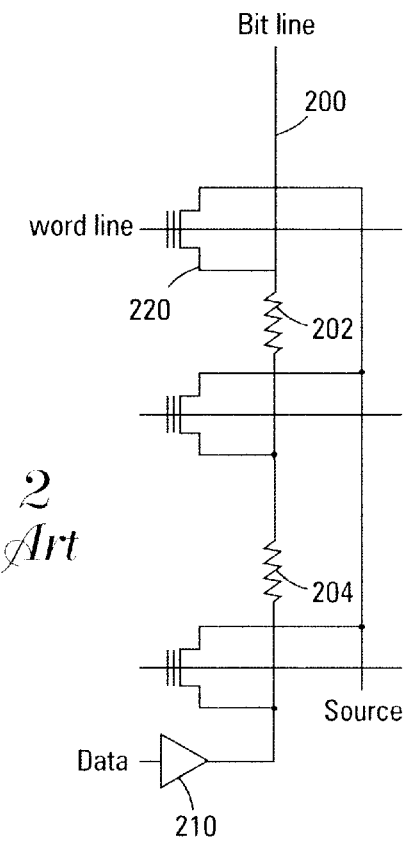
FIG. 2 illustrates a prior art bit line driver.

FIG. 2 illustrates a portion of a prior memory array column, or bit line 200. The bit line is coupled to numerous memory cell drain regions. Resistors 202 and 204 (Rbl) in FIG. 2 together represent the memory bit line resistance. During program operations, a bit line driver circuit 210 is coupled to the bit line to provide a programming voltage. As illustrated, a bit line driver circuit is coupled to one end of the bit line. To program a memory cell 220 located at an opposite end of the bit line, the bit line driver circuit must provide a voltage that accounts for the bit line voltage drop. For example, the single bit line driver circuit must provide a voltage (Vdriver) equal to the desired program voltage (Vd) plus a bit line voltage drop (Vbl). The Vbl can be defined as the bit line resistance (Rbl) times the programming current (Ip). In other words, Vdriver=Vd+(Rbl*Ip).

Figure 3:
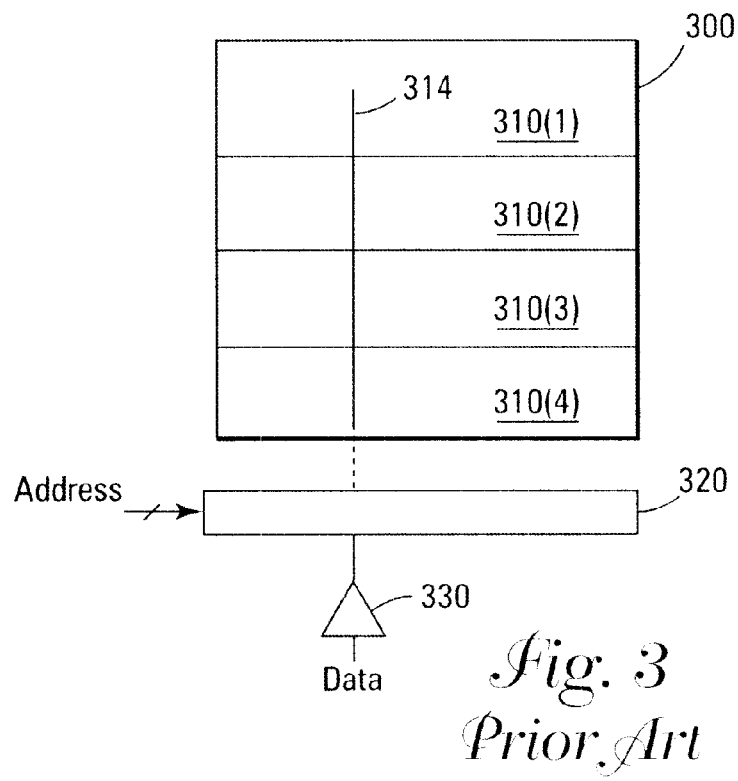
FIG. 3 is a block diagram of a prior art memory array.

FIG. 3 illustrates a general block diagram of a prior art memory array 300. The array is arranged with a plurality of address blocks 310(1)–310(4) that share common bit lines 314 (only one is illustrated). A column decoder circuit 320 is coupled to the array and bit lines. The decoder couples column, or bit line, driver circuitry 330 to a selected column based on address signals. As explained above, the driver circuit must provide a sufficient program voltage to program or erase memory cells at a remote end of the selected bit line.

During a typical erase operation, one of the blocks is selected, such as 310(1). The un-selected blocks 310(2)–310 (4) remain coupled to the selected bit line 314. As such, the un-selected blocks are subjected to the erase voltage coupled to the selected bit line. This erase voltage can disturb the memory cells in the un-selected blocks. In prior memory devices, a time consuming process of checking the memory cells in the un-selected blocks was performed to identify cells that required repair. One embodiment of the present invention provides disturb test rows in the array to estimate a disturb condition of the memory array.

Figure 4:
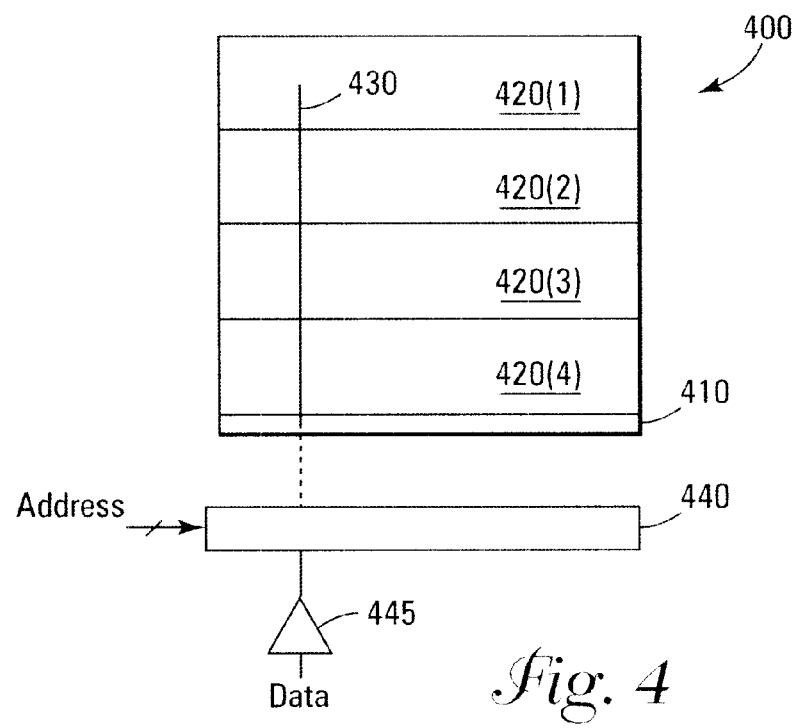
FIG. 4 is a block diagram of a memory array of one embodiment of the present invention.

FIG. 4 illustrates an array 400 of one embodiment of the present invention having a pair of disturb test rows 410. test rows 410 have separate source and word lines from other blocks 420. The test rows are located close to the bit line driver circuitry 445 so that they are subjected to the highest bit line voltage during erase/program operations. This location increases the probability that a memory cell will be disturbed in the test rows first. Further, having both an even and an odd test row in the pair of test rows increases the reliability of a disturb test in the case where one of the rows, typically a mirror image of the other, is more sensitive to disturb. Test rows, as defined herein, are specific addressable groups or blocks of memory cells that are used for test purposes. They are not accessible for standard program and read operations. That is, the test rows are not externally addressable for programming and reading. The test rows, however, can be used as dummy rows (rows whose main purpose is to improve the uniformity of the array) as long as the test rows sources are separate from the selected array sources. Common bit lines 430 (only one illustrates) are coupled to memory arrays blocks 420(1)–420(4) and the pair of disturb test rows 410. Column decode circuitry 440 is used to couple the driver circuitry 445 to a selected column in response to address signals. During manufacturing all cells in the disturb rows are programmed so that they can be disturbed. These cells are never intentionally erased.

A disturb test can be conducted on the test rows as part of an erase operation. That is, the test rows can be read using a relatively low word line voltage following erasure of memory cells in the array. If the low word line voltage activates a memory cell in one or more of the test rows, the memory cell(s) has been disturbed. The control gate voltage level used on the test row word lines can be adjusted to be more sensitive to disturb conditions. That is, the voltage level provided on the control gates can be reduced from a normal operating level to check for disturb conditions. Alternatively, a reference current used to compare to a bit line current from the disturb rows can be adjusted to detect smaller disturb conditions.

Figure 5:
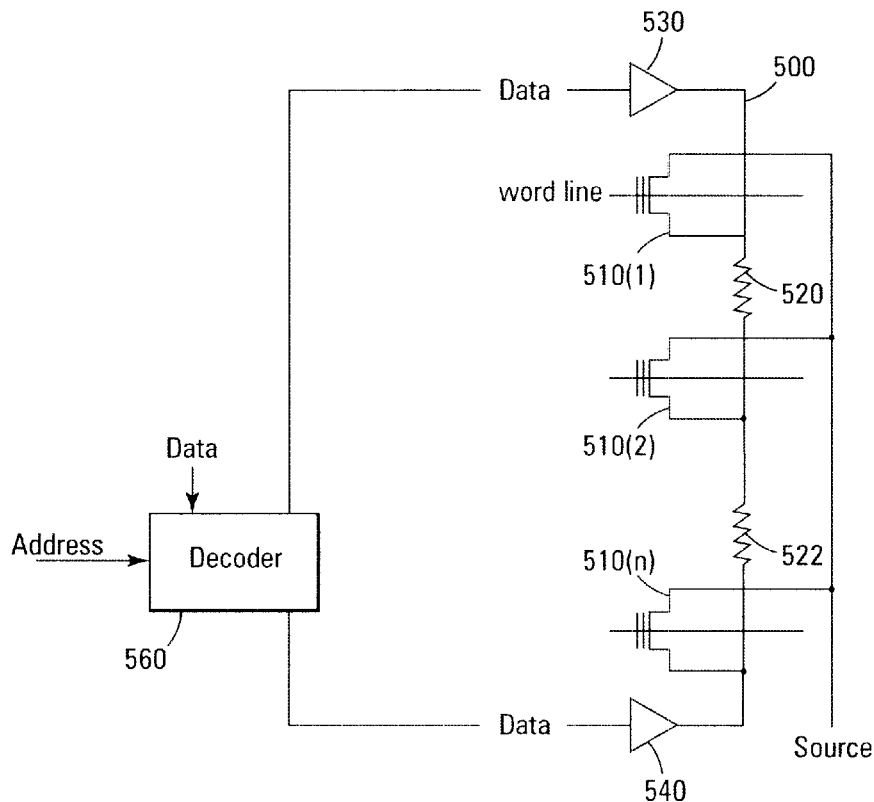
FIG. 5 illustrates a bit line and driver circuit of one embodiment of the present invention.

Referring to FIG. 5, a portion of a memory array column of one embodiment the present invention is illustrated. Bit line 500 is coupled to numerous non-volatile memory cells 510(1)–510(n), such as floating gate memory cells. The bit line can be fabricated using either a conductive or semi-conductive material. For example, the bit line can be fabricated using an aluminum or copper alloy, or a polysilicon material. The bit line is typically fabricated in a symmetrical manner and therefore has a uniform distributed resistance. Resistors 520 and 522 (Rbl) in FIG. 5 represent the memory bit line resistance.

A pair of bit line driver circuits 530 and 540 are coupled to the bit line. Each one of the driver circuits is coupled to an opposite end region of the bit line 500. As such, all of the memory cells of bit line are located within one-half of the bit line resistance, Rbl, to a bit line driver. A memory cell 510(2) located in the center of a bit line defines the required voltage of the driver circuits, Vdriver. The bit line resistance from the driver to the memory cell is half of Rbl, Vdriver=Vd+(Rbl/2*Ip). If the bit line is driven from both ends, the equivalent resistance becomes Rbl/2 twice in parallel, therefore Rbl/4. As a result, Vdriver=Vd+Rbl/4*Ip. Thus, the voltage supplied by both driver circuits can be reduced compared to a single driver configuration.

Figure 8:
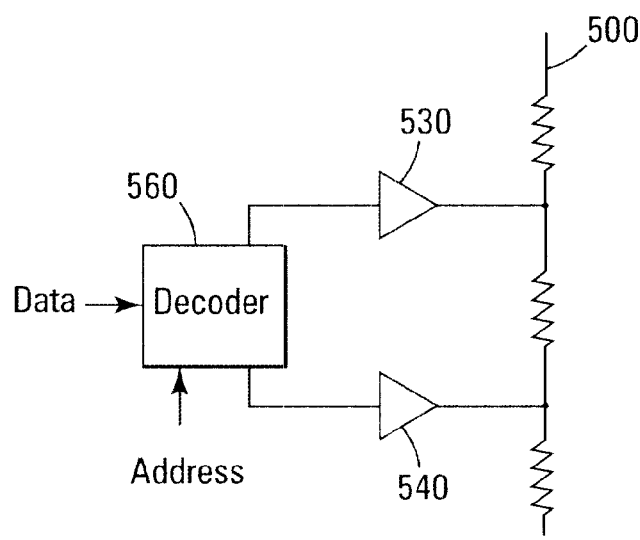
FIG. 8 illustrates a bit line and driver circuitry of an alternate embodiment of the present invention.
Figure 9:
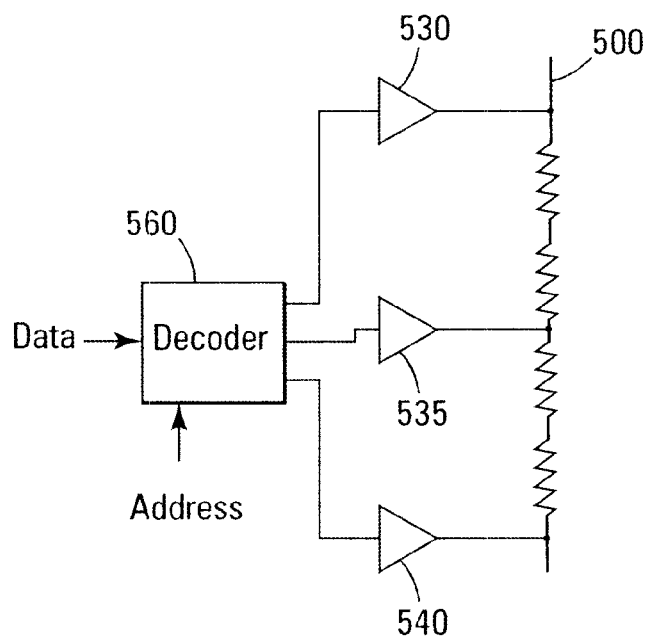
FIG. 9 illustrates a bit line and driver circuit of another embodiment of the present invention.

In an alternate embodiment, the driver circuits 530 and 540 can be distributed along the bit line and not limited to end region locations, see FIG. 8. Likewise, additional driver circuits can be distributed along the bit lines to further reduce the driver voltage requirement. For example, a bit line having a resistance of R is coupled to the non-volatile memory cells, and X distributed driver circuits are coupled to the bit line. A resistance between each of the non-volatile memory cells and any of the driver circuits is less than R/X. With driver circuits at both ends and distributed drivers, the resistance between each of the non-volatile memory cells and any one of the driver circuits is less than R/2(X−1). An equivalent resistance between any memory cell and all of the bit line driver circuits is less than R/4(X−1). That is, by activating all of the distributed driver circuits reduces the equivalent resistance to all of the memory cells, including the worst-case memory cell. See FIG. 9 for a memory that uses three distributed driver circuits 530, 535 and 540.

Figure 6:
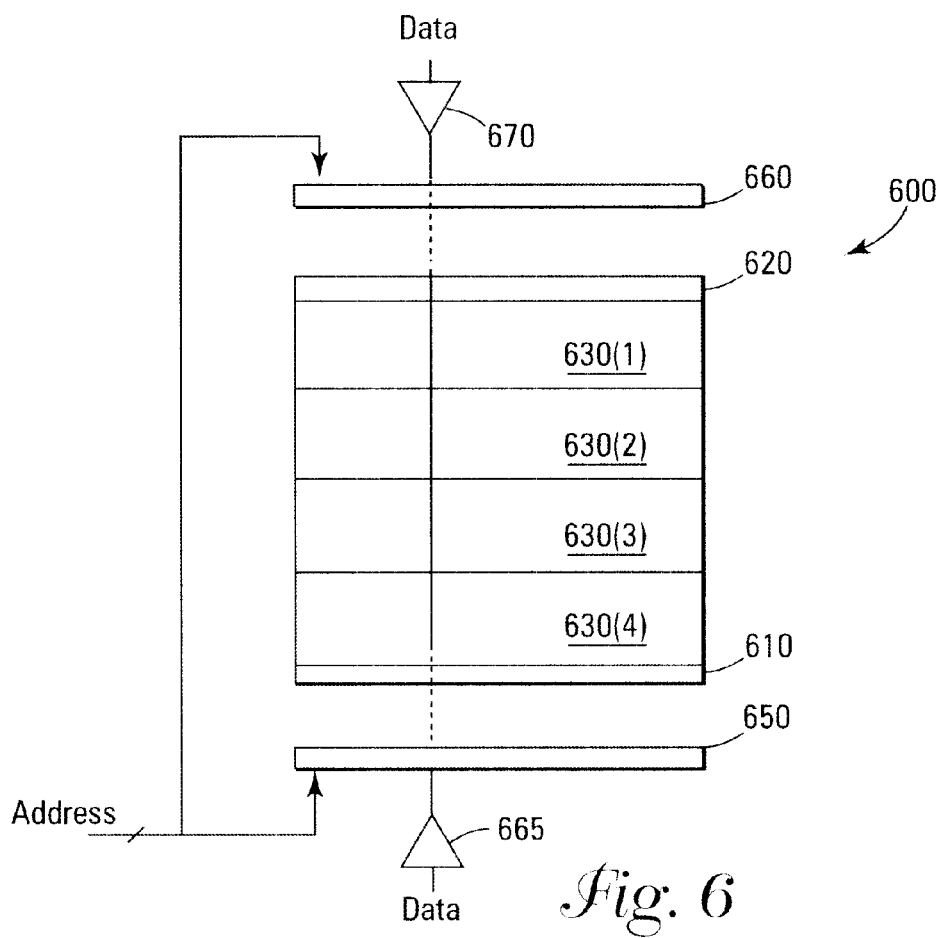
FIG. 6 is a block diagram of another memory array of one embodiment of the present invention.

The bit line driver circuits are selectively activated using decoder circuitry 560. The decoder circuitry activates one or more driver circuits based upon address signals provided by the external processor/controller 102. In one embodiment, all drivers are activated during a write operation on a selected bit line. In another embodiment, one of the driver circuits is activated based on its location relative to a selected row of the memory array. That is, driver 540 is activated to program any memory cells located in the bottom half of the bit line, and driver 530 is activated to program any memory cells located in the top half of the bit line. Unused driver circuits are placed in a tri-state condition. It will be appreciated that activating both drivers at the same time decreases the equivalent resistance to a given cell to Rbl/4 or less and simplifies the decode circuitry. The decoder circuit, in either embodiment, selectively activates the driver circuit(s) in response to address signals provided on external address connections. Multiple test rows are located close to the bit line driver circuits, as illustrated in FIG. 6. Providing multiple test locations close to the drivers keeps the test rows subjected to the highest bit line erase voltages. Only one of the test row pairs need to be tested during erase operations. That is, the test rows located closest to the activated driver are tested for disturb.

FIG. 6 illustrates an array 600 of one embodiment of the present invention having two pairs of disturb test rows 610 and 620. The test rows are located at opposite ends of the array and close to the bit line driver circuits 665 and 670 so that they are subjected to the highest bit line voltage during program operations. This location increases the probability that a memory cell will be disturbed in the test rows first. Further, having both an even and an odd test row in the pair of test rows increases the reliability of a disturb test. Test rows, as defined herein, are specific addressable groups or blocks of memory cells that are used for test purposes. They are not accessible for standard program and read operations. That is, the test rows are not externally addressable for programming and reading. The test rows, however, can be used as dummy rows. Column decoder circuitry is illustrated as two components 650 and 660.

The bit line driver circuits are selectively activated/coupled using the decoder circuitry. The decoder circuitry activates one or both driver circuits based upon the address signals provided by an external processor. In one embodiment, both drivers are activated during a write operation on a selected bit line. In another embodiment, the one of the driver circuits is activated based on its location relative to a selected row of the memory array.

Because the memory cells in the test row are never erased, they will experience the longest disturb time during program and erase operations of any memory cell in the array. These cells are only programmed if leakage has been detected.

Figure 7:
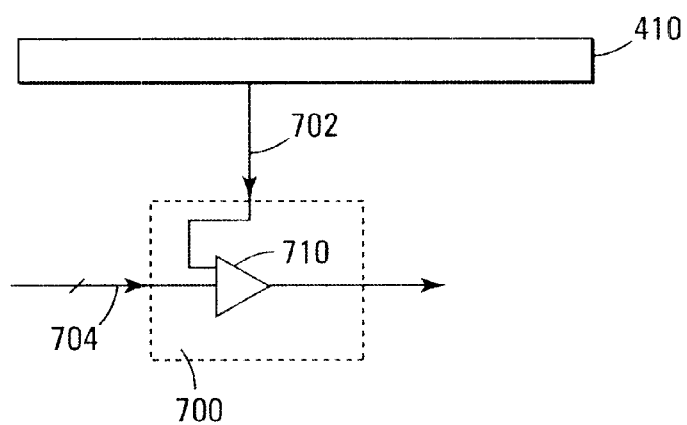
FIG. 7 illustrates a block diagram of one embodiment of a basic disturb circuit.

FIG. 7 illustrates a block diagram of one embodiment of a basic disturb circuit 700 that can be used to look for a disturb condition in the test rows, such as rows 410. The disturb circuit has one input 702 coupled to the bit line, and either one or two reference current inputs 704. The verify circuit 700 includes at least one comparator circuit 710 that is coupled to the bit lines while the memory cells of the test rows are read. The comparator determines if a drain current of the test row memory cell are in an acceptable range or exceeds a predetermined threshold current. If the output of the disturb circuitry indicates that a disturb condition has been detected, corrective action can be taken to maintain the integrity of the data in the remaining memory array. For example, a data recovery operation can be performed on the memory cells located in the memory array blocks that were not erased.

Figure 10:
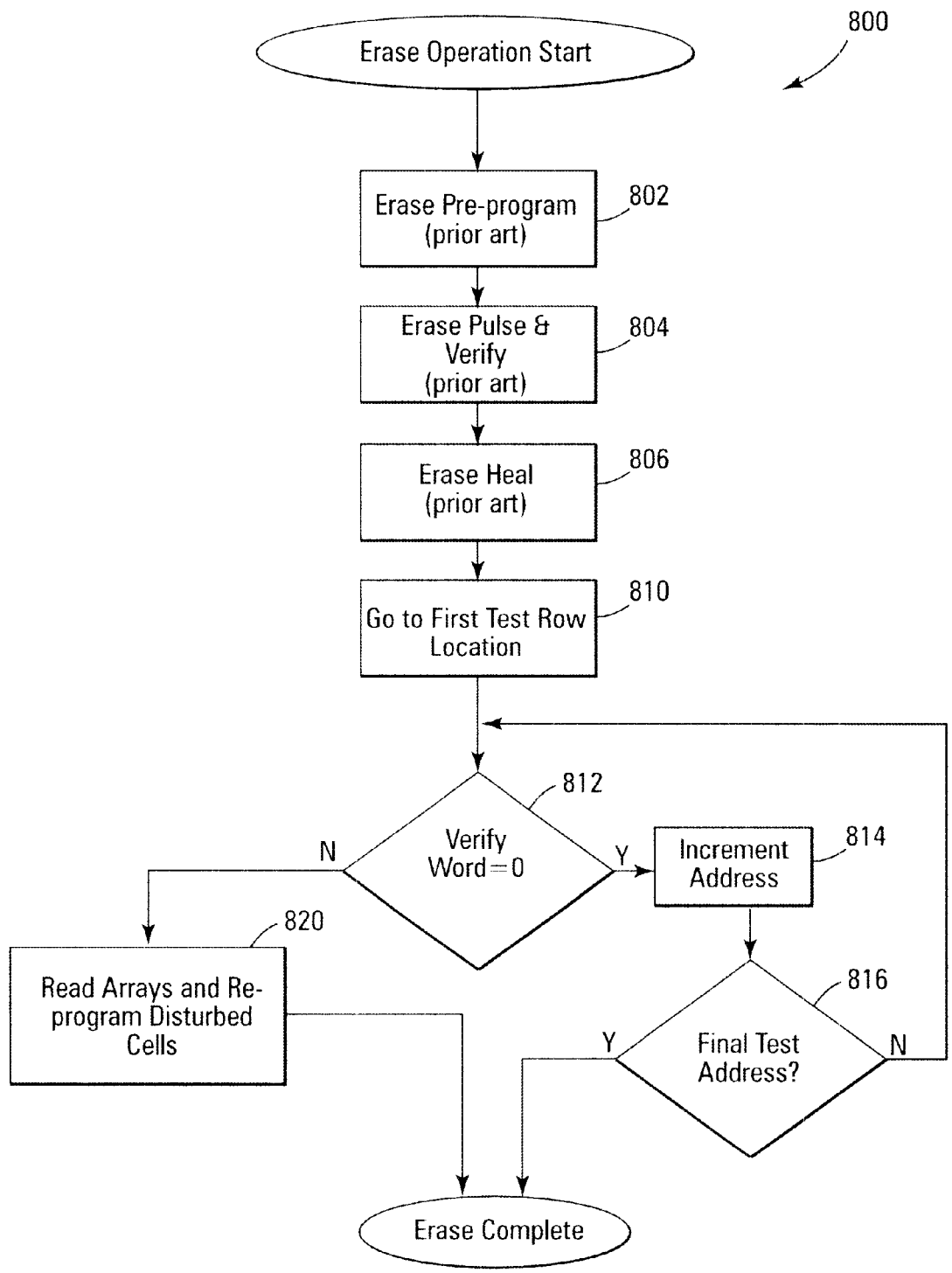
FIG. 10 is a flow chart of an erase algorithm of an embodiment of the present invention.

Referring to FIG. 10, a flow chart of an erase algorithm 800 of an embodiment of the present invention. The erase operation starts with a prior art erase pre-program operation 802. This operation pre-programs the cells to help reduce over-erasure. Erase pulses and verification 804 are performed as known to those skilled in the art. Likewise, prior art heal operations 806 can be performed to recover over-erased cells. Following the heal operation, the memory control accesses the first location in the test rows, 810. The test row words are verified 812 to determine if the data is "0". If the data is "0", the address is incremented 814 and the word verification continues until the final test row location is reached 816. If any of the data is not a "0", a disturb condition has been detected 820. In response to the disturb detection, all arrays and test rows are verified and disturbed bits are re-programmed. One example of this recovery operation is described in U.S. Pat. No. 6,108,241.

CONCLUSION

A non-volatile memory device has been described that has an array of memory cells arranged in rows and columns. The memory cells can be externally accessed for programming, erasing and reading operations. Test rows of memory cells are provided in the array to allow for memory cell disturb conditions. The test rows are not externally accessible for standard program and read operations. The test rows are located near bit line driver circuitry to insure the highest exposure to bit line voltages that may disturb memory cells in the array.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A non-volatile memory device comprising:
   an array of reprogrammable non-volatile memory cells arranged in rows and columns;
   a plurality of bit lines coupled to the non-volatile memory cells;
   a driver circuit coupled to the plurality of bit lines; and
   test rows coupled to the array, wherein the driver circuit comprises first and second bit line drivers located at opposite ends of the array rows, and the test rows comprise first and second pairs of test rows respectively located adjacent to the first and second bit line drivers.

2. The non-volatile memory device of claim 1 wherein the non-volatile memory cells are floating gate transistors.

3. A flash memory device comprising:
   an array of floating gate non-volatile memory cells arranged in rows and columns;
   a bit line coupled to the non-volatile memory cells;
   first and second driver circuits respectively coupled to first and second end regions of the bit line;
   a decoder circuit to selectively couple the first and second driver circuits to the bit line; and
   first and second sets of addressable memory cell test rows coupled to the array and respectively located near the first and second driver circuits.

4. The flash memory device of claim 3 wherein the first and second sets of addressable test rows each comprise two test rows.

5. The flash memory device of claim 3 further comprising a disturb test circuit to determine if the memory cells of the first and second sets of addressable memory cell test rows have been disturbed.

6. A non-volatile memory device comprising:
   an array of non-volatile memory cells arranged in rows and columns;
   a bit line having a resistance of R and coupled to the non-volatile memory cells;
   X distributed driver circuits coupled to the bit line; and
   X pairs of addressable test rows coupled to the array and respectively located near the X driver circuits, wherein X equals two and the two pairs of addressable test rows are located at opposite ends of the bit line.

7. A method of erasing memory cells in a non-volatile memory device comprising:
   initiating an erase operation on memory cells located in a first part of an addressable array of memory cells; and
   performing a disturb test operation on test rows to forecast a lack of memory cell disturb during the erase operation of memory cells located in a second part of the addressable array.

8. The method of claim 7 wherein performing the disturb test operation comprises:
   coupling a predefined word line voltage to memory cells located in the test rows; and
   determining if the memory cells located in the test rows are activated in response to the predefined word line voltage.

9. The method of claim 7 further comprises performing a data recovery operation on the memory cells located in the second part of the addressable array based upon the disturb test operation on the test rows.

10. The method of claim 7 further comprises performing a data recovery operation on the memory cells located in the test rows based upon the disturb test operation on the test rows.

11. The method of claim 7 wherein the test rows comprise two test rows located on an edge of addressable array of memory cells.

12. The method of claim 7 wherein the memory cells are floating gate transistor memory cells.

13. The method of claim 7 further comprising:
   locating the test rows near at least one driver circuit.

14. A method of operating a non-volatile memory device comprising:

initiating an erase operation on a first erase block of memory cells located in an addressable array of memory cells, wherein the array has X erase blocks; and performing a disturb test operation on test rows to forecast a lack of memory cell disturb during the erase operation of memory cells located in remaining X−1 erasable blocks, wherein the test rows are not located within the X erase blocks.

15. The method of claim 14 wherein the test rows comprise two test rows located on an edge of the X erase blocks.

16. The method of claim 14 further comprises performing a data recovery operation on the remaining X−1 erasable blocks based upon the disturb test operation on the test rows.

17. The method of claim 14 wherein the memory cells are floating gate transistor memory cells.

18. The method of claim 14 further comprising:
locating the test rows near at least one driver circuit.

19. A method of operating a non-volatile memory system comprising:

initiating an erase operation on memory cells located in a first block of an array of memory cells of a memory device in response to instructions from an external processor;

performing a disturb test operation on test rows to forecast a lack of memory cell disturb during the erase operation or a prior operation of memory cells located in additional blocks of the array; and performing a data recovery operation on the memory cells located in the additional blocks of the array based upon the disturb test operation.

20. The method of claim 19 wherein the test rows comprise two test rows located on an edge of the array of memory cells.

21. The method of claim 19 wherein the memory cells are floating gate transistor memory cells.

22. The method of claim 19 further comprising:
locating the test rows near at least one driver circuit.

23. A memory system comprising:
a processor; and
a non-volatile memory device coupled to the processor and comprising,
an array of floating gate non-volatile memory cells arranged in rows and columns,
a bit line coupled to the non-volatile memory cells,
first and second driver circuits respectively coupled to first and second end regions of the bit line,
a decoder circuit to selectively couple the first and second driver circuits to the bit line, and
first and second sets of addressable memory cell test rows coupled to the array and respectively located near the first and second driver circuits.

24. The memory system of claim 23 wherein the first and second sets of addressable test rows each comprise two test rows.

25. The memory system of claim 23 further comprising a disturb test circuit coupled to the test rows to determine if the memory cells of the first and second sets of addressable memory cell test rows have been disturbed.

26. A memory device comprising:
an array of memory cells arranged in rows and columns;
a plurality of bit lines coupled to the memory cells;
a first and second driver circuits electrically coupleable to the plurality of bit lines; and first and second sets of test rows coupled to the array and respectively located near the first and second driver circuits, wherein the first and second driver circuits are located at opposite ends of the plurality of bit lines.

27. A memory device comprising:
an array of reprogrammable memory cells arranged in rows and columns;
a plurality of bit lines coupled to the memory cells;
a first and second driver circuits electrically coupleable to the plurality of bit lines;
first and second sets of test rows coupled to the array and respectively located near the first and second driver circuits; and
wherein the first and second driver circuits are activated simultaneously to drive data on the plurality of bit lines.

28. A memory device comprising:
an array of reprogrammable memory cells arranged in rows and columns;
a plurality of bit lines coupled to the memory cells;
a first and second driver circuits electrically coupleable to the plurality of bit lines;
first and second sets of test rows coupled to the array and respectively located near the first and second driver circuits; and
wherein the first and second driver circuits are independently activated to drive data on the plurality of bit lines.

29. A memory device comprising:
an array of memory cells arranged in rows and columns;
a plurality of bit lines coupled to the memory cells;
a first and second driver circuits electrically coupleable to the plurality of bit lines; and
first and second sets of test rows coupled to the array and respectively located near the first and second driver circuits, wherein the first and second driver circuits are independently activated to drive data on the plurality of bit lines and wherein an un-activated driver circuit is placed in a tri-state condition.

30. A memory device comprising:
an array of memory cells arranged in rows and columns;
a plurality of bit lines coupled to the memory cells;
a first and second driver circuits electrically coupleable to the plurality of bit lines; and
first and second sets of test rows coupled to the array and respectively located near the first and second driver circuits, further comprising a disturb circuit coupled to the first and second sets of test rows to determine if the memory cells of the first and second sets of addressable memory cell test rows have been disturbed.

31. A memory device comprising:
an array of reprogrammable memory cells arranged in rows and columns;
a plurality of bit lines coupled to the memory cells;
a first and second driver circuits electrically coupleable to the plurality of bit lines;
first and second sets of test rows coupled to the array and respectively located near the first and second driver circuits;
a third driver circuit electrically coupleable to the plurality of bit lines; and
a third set of test rows coupled to the array and respectively located near the third driver circuit.

32. A non-volatile memory device comprising:

an array of non-volatile memory cells arranged in rows and columns;

a plurality of bit lines coupled to the non-volatile memory cells;

a driver circuit coupled to the plurality of bit lines;

test rows coupled to the array and located near the driver circuit; and a disturb test circuit to determine if the memory cells of the test rows have been disturbed.

33. A flash memory device comprising:

an array of floating gate non-volatile memory cells arranged in rows and columns;

a bit line coupled to the non-volatile memory cells;

first and second driver circuits respectively coupled to first and second end regions of the bit line;

a decoder circuit to selectively couple the first and second driver circuits to the bit line;

first and second sets of addressable memory cell test rows coupled to the array and respectively located near the first and second driver circuits; and a disturb test circuit to determine if the memory cells of the first and second sets of addressable memory cell test rows have been disturbed.

34. A non-volatile memory device comprising:

an array of non-volatile memory cells arranged in rows and columns;

a bit line having a resistance of R and coupled to the non-volatile memory cells;

X distributed driver circuits coupled to the bit line;

X pairs of addressable test rows coupled to the array and respectively located near the X driver circuits; and a disturb test circuit to determine if the memory cells of the X pairs of addressable test rows have been disturbed.

* * * * *